(12) United States Patent
Han et al.

(10) Patent No.: US 11,808,828 B2
(45) Date of Patent: Nov. 7, 2023

(54) MAGNONIC MAGNETO-RESISTANCE DEVICE INCLUDING TWO-DIMENSIONAL SPACER AND ELECTRONIC EQUIPMENT COMPRISING THE SAME

(71) Applicant: Institute of Physics, Chinese Academy of Sciences, Beijing (CN)

(72) Inventors: Xiufeng Han, Beijing (CN); Yaowen Xing, Beijing (CN)

(73) Assignee: Institute of Physics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 17/201,016

(22) Filed: Mar. 15, 2021

(65) Prior Publication Data
US 2021/0293908 A1 Sep. 23, 2021

(30) Foreign Application Priority Data
Mar. 19, 2020 (CN) .......................... 202010196853.2

(51) Int. Cl.
| | | |
|---|---|---|
| *G01R 33/09* | (2006.01) | |
| *H01F 10/32* | (2006.01) | |
| *H01F 10/193* | (2006.01) | |
| *H10N 50/10* | (2023.01) | |
| *H10N 50/85* | (2023.01) | |
| *G01R 33/00* | (2006.01) | |

(52) U.S. Cl.
CPC ......... *G01R 33/093* (2013.01); *G01R 33/095* (2013.01); *H01F 10/193* (2013.01); *H01F 10/325* (2013.01); *H01F 10/3254* (2013.01); *H10N 50/10* (2023.02); *H10N 50/85* (2023.02); *G01R 33/0052* (2013.01)

(58) Field of Classification Search
None
See application file for complete search history.

(56) References Cited

U.S. PATENT DOCUMENTS

| | | | | |
|---|---|---|---|---|
| 8,378,329 | B2* | 2/2013 | Zaliznyak | G11C 11/161 438/102 |
| 9,761,660 | B2* | 9/2017 | Kelber | H01L 29/0669 |
| 2009/0322319 | A1* | 12/2009 | Kreupl | H01L 43/10 324/252 |
| 2010/0109712 | A1* | 5/2010 | Zaliznyak | H01F 10/3218 257/29 |
| 2011/0149670 | A1* | 6/2011 | Heo | G11C 11/161 428/688 |
| 2013/0175588 | A1* | 7/2013 | Kelber | H01L 29/1606 257/295 |
| 2015/0131371 | A1* | 5/2015 | Suh | H01L 43/12 365/158 |
| 2020/0350442 | A1* | 11/2020 | Jo | H01L 29/267 |

* cited by examiner

*Primary Examiner* — Kevin M Bernatz
(74) *Attorney, Agent, or Firm* — RADLO & SU

(57) ABSTRACT

The present disclosure relates to a magnonic magnetoresistance (MMR) device and an electronic equipment including the same. According to one embodiment, a core structure of a MMR device may include: a first ferromagnetic insulating layer (Ferro-magnetic Insulator, $FMI_1$); a two-dimensional conductive material layer (Spacer) set on the first ferromagnetic insulating layer; and a second ferromagnetic insulating layer (Ferro-magnetic Insulator, $FMI_2$) set on the two-dimensional conductive material layer. The MMR device of the present disclosure may enhance interface effect in spin electron transmission and thus improve performance of the MMR device.

10 Claims, 3 Drawing Sheets

MAGNONIC MAGNETO-RESISTANCE DEVICE INCLUDING TWO-DIMENSIONAL SPACER AND ELECTRONIC EQUIPMENT COMPRISING THE SAME

CROSS-REFERENCE TO RELATED APPLICATIONS

This application claims priority to Chinese Patent Application No. 202010196853.2 entitled "Magnonic Magnetoresistance Device Including Two-dimensional Spacer and Electronic Equipment Comprising the Same" filed on Mar. 19, 2020, the disclosure of which is incorporated herein by reference in its entirety.

FIELD OF THE INVENTION

The present application generally relates to the field of magnonics and magnonic devices, and in particular relates to a magnonic magnetoresistance (MMR) device including a two-dimensional conductive material layer as spacer and electronic equipment comprising the MMR device.

BACKGROUND

Since discovery of tunneling magnetoresistance (TMR) effect in Fe/Ge/Co multi-layered film in 1975 and discovery of giant magnetoresistance (GMR) effect in a magnetic multi-layered film in 1988, researches and applications on physics and material science in the field of spintronics have made a great progress. Especially, tunneling transport property and TMR effect of spin-related electrons in a magnetic tunnel junction have become one of the important research fields in condensed matter physics. In 1995, Miyazaki et al. and Moderola et al. respectively discovered a high room-temperature TMR effect in the "ferromagnetic metal/Al—O insulating barrier/ferromagnetic metal", and once again, a wave of research on magnetoresistance effect has been set off. In the aspect of device application, Johnson proposed a "ferromagnetic metal/nonmagnetic metal/ferromagnetic metal" sandwich all-metal spin transistor structure composed of a ferromagnetic metal emitter, a non-magnetic metal base and a ferromagnetic metal collector in 1993 [see M. Johnson's article, Science 260 (1993) 320]. The all-metal transistor may have a speed analogous to that of a semiconductor Si device, but may have 10-20 times lower power consumption, about 50 times higher density, and may be radiation resistant, and has memory function, and further it may be applied to various logic circuits and processors, etc. of future quantum computers. In 1994, IBM developed a read head utilizing the GMR effect to increase the magnetic hard disk storage density by 17 times to reach 3 Gb/in$^2$. At present, the magnetic read head technology based on the TMR effect has increased the magnetic hard disk storage density to more than 2000 Gb/in$^2$.

The traditional GMR spin valve structure uses a sandwich structure of "magnetic layer/intermediate layer/magnetic layer", wherein the magnetic layer is formed of a ferromagnetic conductive material and the intermediate layer generally uses a non-magnetic conductive metal layer such as Cu, Ru etc. Current can flow through the GMR spin valve structure vertically or in plane to generate magnetoresistance by using parallel and antiparallel configurations of magnetic moments of the two magnetic layers. At present, it has been determined that magnetoresistance is a kind of interface effect, which mainly uses polarization and scattering of electrons at the interface between the magnetic layer and the intermediate layer to generate a spin polarization current, and then, uses the parallel configuration and the antiparallel configuration of the magnetic moments of the two magnetic layers to regulate the transportation of the spin polarization current, thereby generating a magnetoresistance. However, for the GMR spin valve device of the present bulk structure, in a case where electrons flow in the upper magnetic layer and the lower magnetic layer and the intermediate conductive spacing layer, it will not only be subject to a certain degree of spin scattering, but also quite a portion of the spin polarized current will be shunted in the upper magnetic layer and the lower magnetic layer, which will significantly reduce the magnitude of the magnetoresistance of the GMR spin valve structure and will increase the background noise.

Thus it can be seen that the traditional GMR devices still have many deficiencies, which limits their practical application scope. Therefore, it needs to continue to explore new spin devices to overcome the above-mentioned or other deficiencies in the prior Art.

SUMMARY OF THE INVENTION

One exemplary embodiment provides a magnonic magnetoresistance (MMR) device, which may comprise: a first ferromagnetic insulating layer; a two-dimensional conductive material layer set on the first ferromagnetic insulating layer; and a second ferromagnetic insulating layer set on the two-dimensional conductive material layer.

In some examples, the two-dimensional conductive material layer may have a thickness of 1-10 atomic layer(s), preferably a thickness of 1-5 atomic layer(s), more preferably a thickness of 1-3 atomic layer(s).

In some examples, the two-dimensional conductive material layer may comprise ferromagnetic material, antiferromagnetic material or non-magnetic material. The examples of the ferromagnetic material may include $Co_2S_2$, $CoBr_2$, $CoC_2$, $Cr_2C$, $CrBr_3$, $CrC_2$, $CrCl_3$, $CrGaTe_3$, $CrI_3$, $CrOBr$, $CrWGe_2Te_6$, $CrWI_6$, $ErSe$, $EuOBr$, $FeBr_2$, $FeC_2$, $Fe_3GeTe_2$, $FeI_2$, $MnC_2$, $NiBr_2$, $NiC_2$, $NiI_2$, and $VC_2$, the examples of the antiferromagnetic material may include $Fe_2O_3$, $CoI_2$, $CoO_2$, $NiO_2$, $CrI_2$, $CrSe_2$, $FeSe$, $MnBr_2$, $MnI_2$, $VBr_2$, and $VI_2$, and the examples of the non-magnetic material may include AgBr, As, AuBr, AuSe, Bi, $Bi_2Se_3$, $Bi_2Te_3$, BN, C, $CaI_2$, $CdBr_2$, $CdI_2$, $Cu_2Te$, CuBr, CuI, CuTe, FeS, GaGeTe, GaS, GaSe, GaTe, $GeI_2$, GeS, GeSe, $Hf_3Te_2$, HfS$_2$, HfSe$_2$, HfTe$_2$, HgI$_2$, In$_2$Se$_3$, InSe, LaI$_2$, MgBr$_2$, MgI$_2$, MoS$_2$, MoSe$_2$, MoTe$_2$, NbS$_2$, NbSe$_2$, NbTe$_2$, NdI$_2$, OLuI, PbI$_2$, PbO, PbTe, PdS$_2$, PtO$_2$, PtS$_2$, PtSe$_2$, ReSe$_2$, Sb, Sb$_2$Te$_3$, SiTe$_2$, SnO, SnS$_2$, SnSe$_2$, SnTe, SrI$_2$, TaS$_2$, TaSe$_2$, TiBr$_2$, TiNI, TiS$_2$, TiSe$_2$, TiTe$_2$, Tl$_2$O, Tl$_2$S, T$_1$F, W$_2$N$_3$, WS$_2$, WSe$_2$, WTe$_2$, YbI$_2$, ZnBr$_2$, ZnI$_2$, ZrBr, ZrI$_2$, ZrS$_2$, ZrSe$_2$, and ZrTe$_2$.

In some examples, the two-dimensional conductive material layer may comprise a two-dimensional topological material.

In some examples, the two-dimensional conductive material layer may comprise a two-dimensional superconducting material.

In some examples, each of the first ferromagnetic insulating layer and the second ferromagnetic insulating layer may comprise one or more of the following materials: $R_3Fe_5O_{12}$, $MFe_2O_4$, $Fe_3O_4$, $BaFe_{12}O_{19}$, $SrFe_{12}O_{19}$, and their doped compound, wherein R is Y, La, Ce, Pr, Nd, Sm, Eu, Gd, Tb, Dy, Ho, Er, Tm, Yb or Lu, and M is Mn, Zn, Cu, Ni, Mg or Co.

In some examples, the first ferromagnetic insulating layer may be a reference magnetic layer with a fixed magnetization direction, and the second ferromagnetic insulating layer may be a free magnetic layer whose magnetization direction changes with an external magnetic field.

Another exemplary embodiment provides an electronic equipment, which may comprise the above-mentioned MMR device.

In some examples, the electronic equipment may be a magnetic sensor.

The above and other features and advantages of the present disclosure will be apparent from the following description to exemplary embodiments when taken in conjunction with the drawings.

DETAILED DESCRIPTION OF THE EMBODIMENTS

One conventional method of enhancing the interface effect to improve the performance of the GMR spin valve structure is to make the intermediate conductive layer very thin to reduce the transmission of electrons in the bulk. However, this method has a lot of disadvantages. Firstly, electrons are still transmitted in the two ferromagnetic conductors, especially for vertical current, and thus the improvement of the interface effect is very limited. On the other hand, generally speaking, the conductive performance of the intermediate conductive layer can be higher than that of the ferromagnetic layers on both sides, and the reduction of the thickness of the traditional bulk intermediate conductive layer will increase the resistance of the GMR spin valve structure, which reduces the current and thus reduces the magnetoresistance effect instead. Therefore, it is difficult to improve the performance of the conventional GMR spin valve structure by reducing the thickness of the intermediate layer.

In view of the above problem, the present inventors propose a new structure capable of constraining the current in the intermediate conductive layer, and the intermediate conductive layer may have a very thin thickness and meanwhile have good conductivity, forming in-plane current similar to two-dimensional electron gas. The in-plane current can be more affected by the upper ferromagnetic layer and the lower ferromagnetic layer interfaces during transmission, so that the MMR effect can be improved. Moreover, since the current is prevented from being transmitted in the upper ferromagnetic insulating layer and the lower ferromagnetic insulating layer, the MMR magnonic valve structure of the present disclosure also has a significantly reduced noise.

Figure 1:
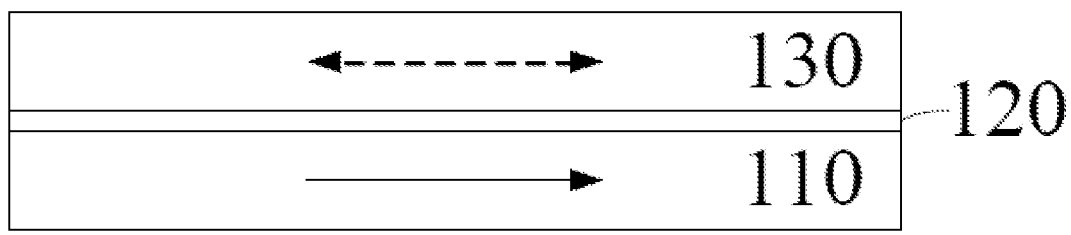
FIG. 1 is a schematic diagram of layered structures of a MMR device according to an exemplary embodiment of the present disclosure.
Figure 1:
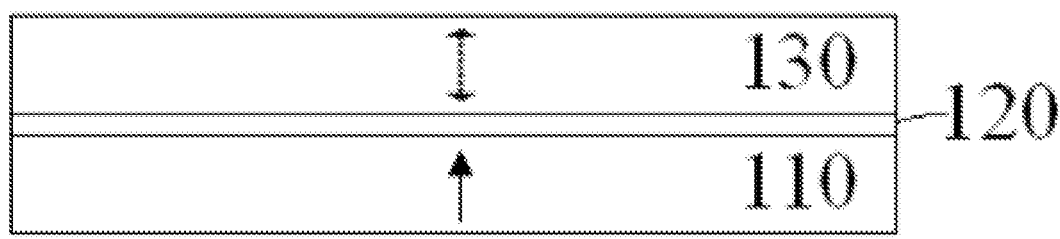

FIG. 1 is a schematic diagram of layered structures of a MMR device 100 according to an exemplary embodiment of the present disclosure. As shown in FIG. 1, the MMR device 100 includes a first ferromagnetic insulating layer 110, a second ferromagnetic insulating layer 130, and a two-dimensional conductive material layer 120 located therebetween.

Each of the first ferromagnetic insulating layer 110 and the second ferromagnetic insulating layer 130 may be formed of a ferromagnetic insulating material, and the examples thereof include, but not limited to, $R_3Fe_5O_{12}$, wherein R may be Y, La, Ce, Pr, Nd, Sm, Eu, Gd, Tb, Dy, Ho, Er, Tm, Yb or Lu; $MFe_2O_4$, wherein M may be Mn, Zn, Cu, Ni, Mg, or Co; and $Fe_3O_4$, $BaFe_{12}O_{19}$, $SrFe_{12}O_{19}$, etc.

In some examples, the first ferromagnetic insulating layer 110 may have a fixed magnetization direction that does not change during device operation, as indicated by a solid arrow; while the second ferromagnetic insulating layer 130 may have a free magnetization direction that may change with an external magnetic field, as indicated by a bidirectional dashed arrow. The magnetization direction of the first ferromagnetic insulating layer 110 may be fixed by various manners, for example, by antiferromagnetic pinning, hard magnetic pinning, synthetic antiferromagnetic (SAF) structure, self-pinning, etc., and all of these manners are known in the art, therefore, those will not be described in detail.

It should also be noted that although FIG. 1 shows an in-plane magnetization direction, the first ferromagnetic insulating layer 110 and the second ferromagnetic insulating layer 130 may also have a perpendicular magnetization direction. It should be understood for those skilled in the art that the setting of the magnetization directions of the first ferromagnetic insulating layer 110 and the second ferromagnetic insulating layer 130 may be similar to the setting of the magnetization directions of two ferromagnetic conductive layers in conventional GMR spin valve structure.

The two-dimensional conductive material layer 120 may be formed of various two-dimensional materials capable of conducting electricity, such as metals, semi-metals, or semiconductors, and the like, and examples thereof will be described in detail below. As an example, the two-dimensional conductive material layer 120 may include, for example, a two-dimensional topological material or a two-dimensional superconducting material. Wherein, the two-dimensional superconducting material is optimal because the superconducting property thereof contribute to reduce background noise caused by resistance, thus improving the magnetoresistance of the device.

In the MMR device 100, since the upper ferromagnetic layer 110 and the lower ferromagnetic layer 130 are both insulating layers, current may only flow in the plane of the two-dimensional conductive material layer 120. However, due to the influence of the first ferromagnetic insulating layer 110 and second ferromagnetic insulating layer 130 on the spin polarization current transportation at the interface, the device 100 may also show the MMR effect, whose principle is substantially the same as that of a conventional GMR device. In short, in a case where the magnetization direction of the first ferromagnetic insulating layer 110 and that of the second ferromagnetic insulating layer 130 are the same each other, electrons having the same spin polarity as the magnetic moment are subject to less scattering, therefore, the resistance of the MMR device 100 is low; in a case where the magnetization direction of the first ferromagnetic insulating layer 110 and that of the second ferromagnetic insulating layer 130 are opposite to each other, all electrons are subject to more scattering, therefore, the resistance of the MMR device 100 is high, thus a MMR effect is shown. The biggest difference from the conventional GMR device is that in the MMR device 100, the electrons flow only in the two-dimensional conductive material layer 120 and do not flow in the ferromagnetic insulating layer 110 and the ferromagnetic insulating layer 130. Since the thickness of the two-dimensional conductive material layer 120 is very thin, the electrons can more interact with the upper ferromagnetic layer and the lower ferromagnetic layer interfaces, thus, the influence of the upper ferromagnetic layer and the lower ferromagnetic layer on the spin electron transmission is more significant, so that the MMR effect is higher, and meanwhile, the noise of the device is smaller.

It may be understood that in the MMR device 100, since the first ferromagnetic insulating layer 110 and the second ferromagnetic insulating layer 130 do not participate in electron transmission, therefore, there is no particular limitation on the thickness thereof, and it is only necessary to consider providing a suitable magnetic moment.

Figure 2A:
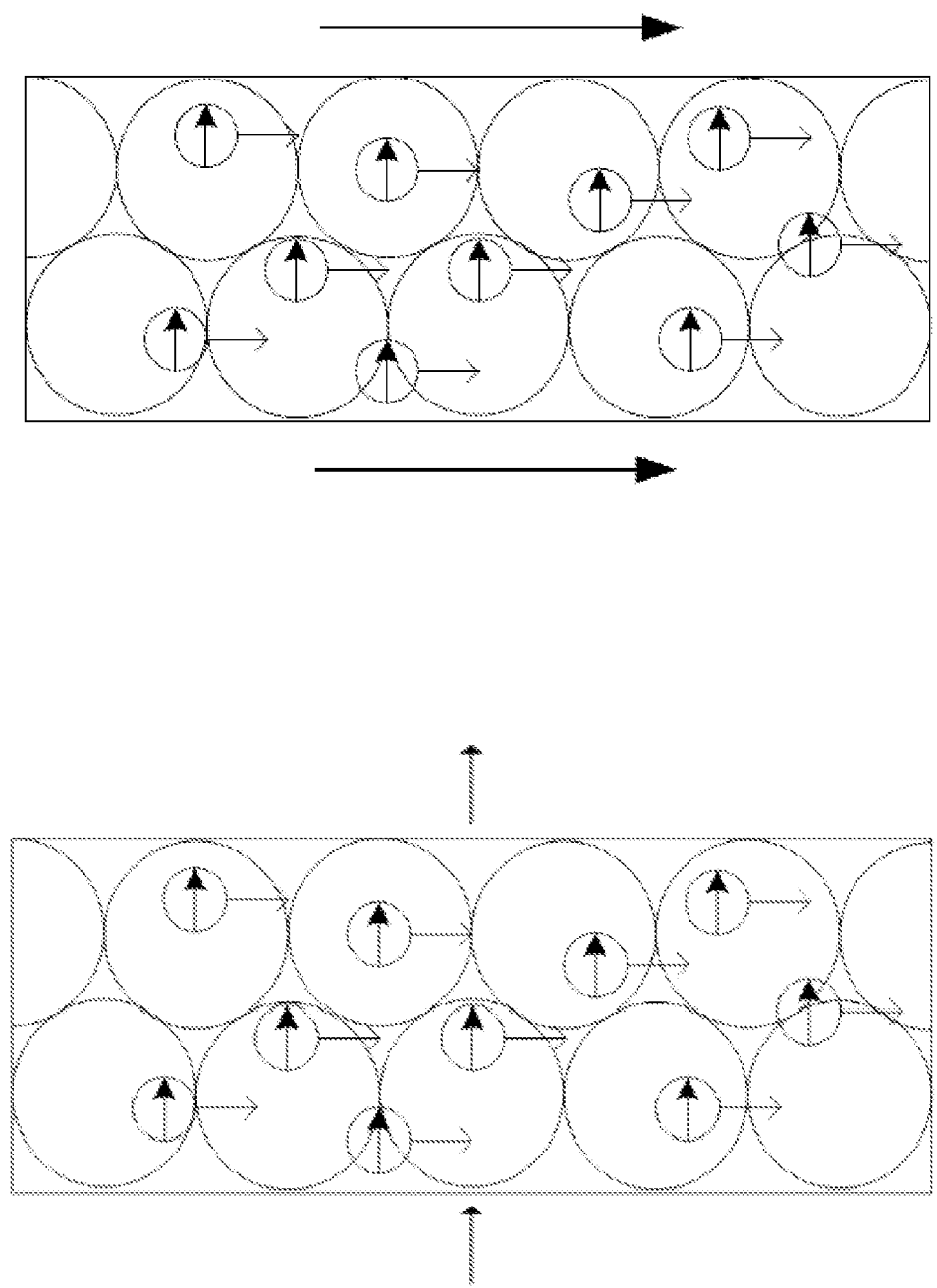
FIG. 2A is a schematic diagram of transmission of electrons in a two-dimensional material layer in a case where the magnetic moments of the ferromagnetic layers are parallel to each other.
Figure 2B:
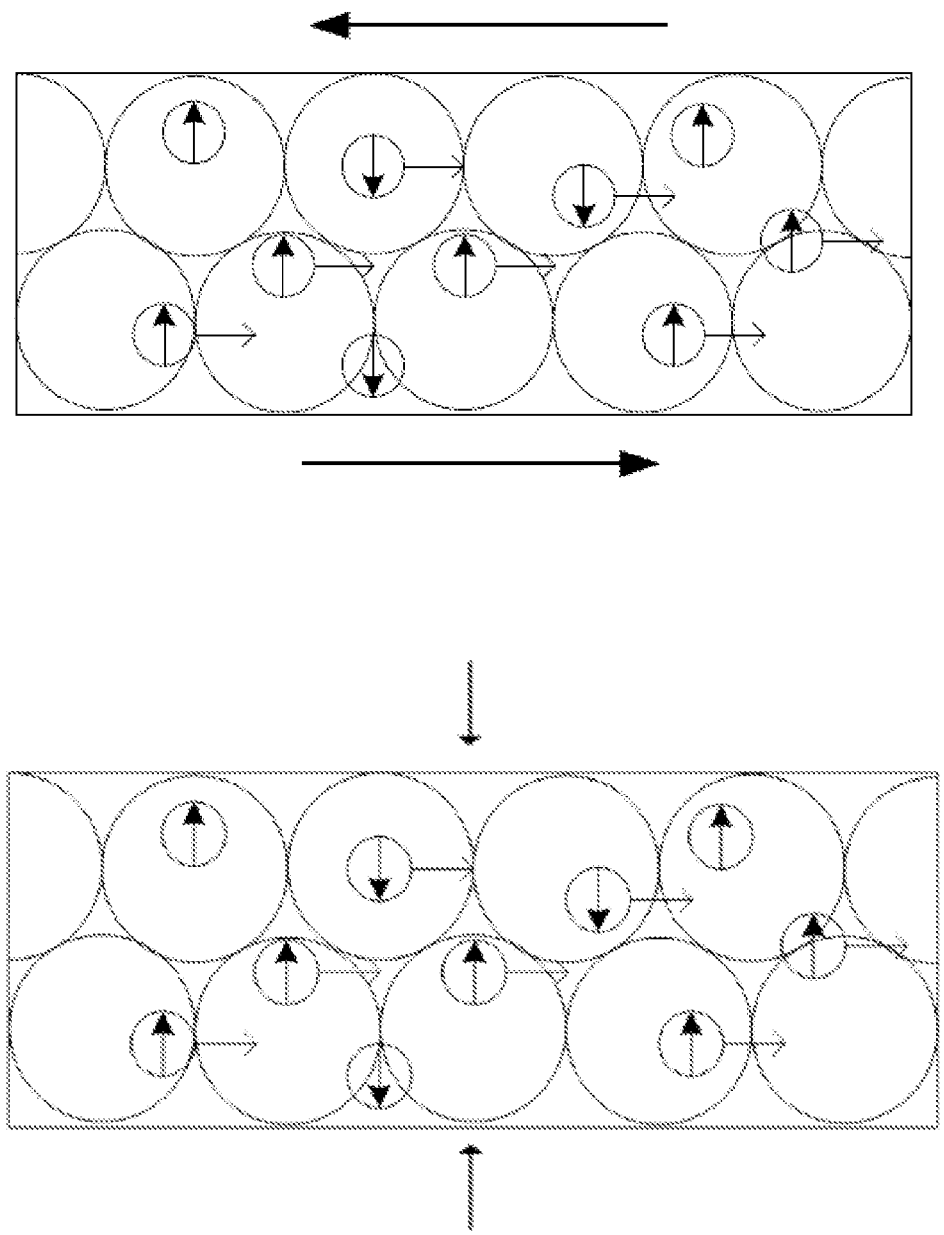
FIG. 2B is a schematic diagram of transmission of electrons in a two-dimensional material layer in a case where the magnetic moments of the ferromagnetic layers are antiparallel to each other.

FIG. 2A and FIG. 2B are schematic diagrams showing transmission of electrons in a two-dimensional conductive material layer 120 in a case where both the upper ferromagnetic layer and the lower ferromagnetic layer are parallel (FIG. 2A) or antiparallel (FIG. 2B), respectively. Large circles represent atomic layers in the two-dimensional conductive material layer 120 in FIG. 2A and FIG. 2B, wherein two atomic layers are schematically shown, however, the two-dimensional conductive material layer 120 may have more (e.g. three or more) or fewer (e.g. one) atomic layer(s). The small circles represent electrons, wherein an upward arrow or an downward arrow in the small circle represents a spin method of the electron, the arrow on the right side of the small circle represents the direction of electron transmission, and the long arrows on the upper and lower sides of the rectangle respectively represent the magnetization direction of the upper ferromagnetic insulating layer and the lower ferromagnetic insulating layer.

As shown in FIG. 2A, in a case where the magnetic moments of the upper ferromagnetic layer and the lower ferromagnetic layer are parallel to each other, electrons in a specific spin direction (the example in the figure is upward) are subject to less scattering, therefore, they can be easily transmitted along the interface direction, and at this time, the resistance of the MMR device 100 is relatively lower, such as $R_1$.

As shown in FIG. 2B, in a case where the magnetic moments of the upper ferromagnetic layer and the lower ferromagnetic layer are antiparallel to each other, at the upper interface, electrons that spin downward are subject to less scattering and can be easily transmitted in the desired direction, and the electrons that spin upward are subject to more scattering and are difficult to be transmitted in the desired direction. On the other hand, at the lower interface, electrons that spin upward are subject to less scattering and can be easily transmitted in the desired direction, and the electrons that spin downward are subject to more scattering and are difficult to be transmitted in the desired direction. In general, the resistance of the MMR device 100 increases, for example, $R_2$.

Therefore, by adjusting the magnetic moment of the free magnetic layer to be parallel or antiparallel to the reference magnetic layer, the resistance of the MMR device 100 can be controlled, thereby generating the MMR=$(R_2-R_1)/R_2 \times 100\%$.

As mentioned above, the two-dimensional conductive material layer 120 can be a non-magnetic material like the traditional intermediate layer. Examples of non-magnetic two-dimensional conductive materials include the following materials: AgBr, As, AuBr, AuSe, Bi, $Bi_2Se_3$, $Bi_2Te_3$, BN, C, $CaI_2$, $CdBr_2$, $CdI_2$, $Cu_2Te$, CuBr, CuI, CuTe, FeS, GaGeTe, GaS, GaSe, GaTe, $GeI_2$, GeS, GeSe, $Hf_3Te_2$, $HfS_2$, $HfSe_2$, $HfTe_2$, $HgI_2$, $In_2Se_3$, InSe, $LaI_2$, $MgBr_2$, $MgI_2$, $MoS_2$, $MoSe_2$, $MoTe_2$, $NbS_2$, $NbSe_2$, $NbTe_2$, $NdI_2$, OLuI, $PbI_2$, PbO, PbTe, $PdS_2$, $PtO_2$, $PtS_2$, $PtSe_2$, $ReSe_2$, Sb, $Sb_2Te_3$, $SiTe_2$, SnO, $SnS_2$, $SnSe_2$, SnTe, $SrI_2$, $TaS_2$, $TaSe_2$, $TiBr_2$, TiNI, $TiS_2$, $TiSe_2$, $TiTe_2$, $Tl_2O$, $Tl_2S$, $T_1F$, $W_2N_3$, $WS_2$, $WSe_2$, $WTe_2$, $YbI_2$, $ZnBr_2$, $ZnI_2$, ZrBr, $ZrI_2$, $ZrS_2$, $ZrSe_2$, and $ZrTe_2$. Wherein, for example, graphene (C), molybdenum disulfide ($MoS_2$), etc., have excellent conductivity and high mobility, and are preferred materials for the two-dimensional conductive material layer 120. The thickness of the non-magnetic two-dimensional conductive material layer 120 may be, for example, thickness of 1-10 atomic layer(s), preferably thickness of 1-5 atomic layer(s), more preferably thickness of 1-3 atomic layer(s).

On the other hand, unlike the traditional non-magnetic intermediate layer, the two-dimensional conductive material layer 120 may also be a ferromagnetic material or an antiferromagnetic material. In a case where the two-dimensional conductive material layer 120 is a ferromagnetic material or an antiferromagnetic material, its thickness may be, for example, thickness of 2-10 atomic layers, preferably thickness of 2-5 atomic layers. At this time, the magnetic moment of one or more atomic layers of the ferromagnetic or antiferromagnetic two-dimensional conductive material layer 120 adjacent to the upper free ferromagnetic layer may vary with the direction of the magnetic moment of the free ferromagnetic layer, while the magnetic moment of one or more atomic layers adjacent to the lower reference ferromagnetic layer may be consistent with the direction of the magnetic moment of the lower reference ferromagnetic layer. In this way, the electron flow is transmitted in the parallel or antiparallel magnetized two-dimensional conductive material layer 120, which can further improve the MMR effect.

Examples of ferromagnetic two-dimensional materials that can be used for the two-dimensional conductive material layer 120 include $Co_2S_2$, $CoBr_2$, $CoC_2$, CoCb, $Cr_2C$, $Cr_2NO_2$, $CrBr_3$, $CrC_2$, $CrGaTe_3$, $CrI_3$, CrOBr, $CrWGe_2Te_6$, $CrWI_6$, ErSe, EuOBr, $FeBr_2$, $FeC_2$, $Fe_3GeTe_2$, $FeI_2$, $MnC_2$, $NiBr_2$, $NiC_2$, $NiI_2$, $TiCl_3$, and $VC_2$, and the examples of antiferromagnetic materials that can be used for the two-dimensional conductive material layer 120 include $Fe_2O_3$, $CoI_2$, $CoO_2$, $NiO_2$, $CrI_2$, $CrSe_2$, FeSe, $MnBr_2$, $MnI_2$, $VBr_2$, and $VI_2$.

Various methods can be used to prepare the MMR device 100 shown in FIG. 1. For example, the grown two-dimensional conductive material layer 120 can be transferred to the first ferromagnetic insulating layer 110, and then the second ferromagnetic insulating layer 130 can be laminated to the two-dimensional conductive material layer 120, alternatively, after the first ferromagnetic insulating layer 110 is deposited in a first equipment, such as a magnetron sputtering equipment, it may be transferred to a second equipment, such as a chemical vapor deposition (CVD) equipment, to grow the two-dimensional conductive material layer 120, and then it may be transferred to the first equipment to continue depositing the second ferromagnetic insulating layer 130. Of course, in addition to the magnetron sputtering equipment and chemical vapor deposition equipment described as examples, other current commonly used equipments such as pulse laser deposition (PLD) or molecular beam epitaxy (MBE), etc. or devices developed in the future can also be used to deposit or grow each layer of the MMR device 100.

It should be understood that the MMR device 100 of the present disclosure may be applied to various electronic equipments like traditional GMR devices. For example, the MMR device 100 can be used as a magnetic sensor in a read head of a magnetic storage equipment or can be used in a positioning equipment or in a navigation equipment such as an electronic compass, the structures of these electronic equipments are known in the related art, and detailed descriptions thereof are omitted here. The MMR device 100 may also be used in other electronic equipments such as switches and modulators for magneton flow (spin wave) transmission, which will not be all enumerated here.

The above description has been provided for the purposes of illustration and description. In addition, this description is not intended to limit the embodiments of the present disclosure to the forms disclosed herein. Although various exemplary aspects and embodiments have been discussed above, those skilled in the art will recognize certain variations, modifications, alterations, additions and sub-combinations thereof

What is claimed is:

1. A magnonic magnetoresistance (MMR) device, comprising:
    a first ferromagnetic insulating layer;
    a two-dimensional conductive material layer set on the first ferromagnetic insulating layer; and
    a second ferromagnetic insulating layer set on the two-dimensional conductive material layer,
    wherein each of the first ferromagnetic insulating layer and the second ferromagnetic insulating layer comprises one or more of the following materials: $R_3Fe_5O_{12}$, $MFe_2O_4$, $BaFe_{12}O_{19}$, and $SrFe_{12}O_{19}$, and their doped compounds, wherein R is Y, La, Ce, Pr, Nd, Sm, Eu, Gd, Tb, Dy, Ho, Er, Tm, Yb or Lu, an M is Mn, Zn, Cu, Ni, Mg or Co.

2. The MMR device of claim 1, wherein the two-dimensional conductive material layer has thickness of 1-10 atomic layer(s).

3. The MMR device of claim 1, wherein the two-dimensional conductive material layer comprises ferromagnetic material, antiferromagnetic material or non-magnetic material.

4. The MMR device of claim 3, wherein the ferromagnetic material is selected from one of two-dimensional materials comprising $Co_2S_2$, $CoBr_2$, $CoC_2$, $Cr_2C$, $CrBr_3$, $CrC_2$, $CrGaTe_3$, $CrI_3$, $CrOBr$, $CrWGe_2Te_6$, $CrWI_6$, $ErSe$, $EuOBr$, $FeBr_2$, $FeC_2$, $Fe_3GeTe_2$, $FeI_2$, $MnC_2$, $NiBr_2$, $NiC_2$, $NiI_2$, and $VC_2$ or combination thereof, the antiferromagnetic material is selected from one of two-dimensional materials comprising $Fe_2O_3$, $CoI_2$, $CoO_2$, $NiO_2$, $CrI_2$, $CrSe_2$, $FeSe$, $MnBr_2$, $MnC_{12}$, $MnI_2$, $VBr_2$, and $VI_2$ or combination thereof, and the non-magnetic material is selected from one of two-dimensional materials comprising AgBr, As, AuBr, AuSe, Bi, $Bi_2Se_3$, $Bi_2Te_3$, BN, C, $CaI_2$, $CdBr_2$, $CdI_2$, $Cu_2Te$, CuBr, CuI, CuTe, FeS, GaGeTe, GaS, GaSe, GaTe, $GeI_2$, GeS, GeSe, $Hf_3Te_2$, $HfS_2$, $HfSe_2$, $HfTe_2$, $HgI_2$, $In_2Se_3$, InSe, $LaI_2$, $MgBr_2$, $MgI_2$, $MoS_2$, $MoSe_2$, $MoTe_2$, $NbS_2$, $NbSe_2$, $NbTe_2$, $NdI_2$, OLuI, $PbI_2$, PbO, PbTe, $PdS_2$, $PtO_2$, $PtS_2$, $PtSe_2$, $ReSe_2$, Sb, $Sb_2Te_3$, $SiTe_2$, SnO, $SnS_2$, $SnSe_2$, SnTe, $SrI_2$, $TaS_2$, $TaSe_2$, $TiBr_2$, TiNI, $TiS_2$, $TiSe_2$, $TiTe_2$, $T_{120}$, $Tl_2S$, TlF, $W_2N_3$, $WS_2$, $WSe_2$, $WTe_2$, $YbI_2$, $ZnBr_2$, $ZnI_2$, ZrBr, $ZrI_2$, $ZrS_2$, $ZrSe_2$, and $ZrTe_2$ or combination thereof.

5. The MMR device of claim 1, wherein the two-dimensional conductive material layer comprises a two-dimensional topological material and a two-dimensional superconducting material.

6. The MMR device of claim 1, wherein the first ferromagnetic insulating layer is a reference magnetic layer with a fixed magnetization direction, and the second ferromagnetic insulating layer is a free magnetic layer whose magnetization direction changes with an external magnetic field.

7. An electronic equipment, which comprises the MMR device of any one of claims 1-4 and 5.

8. The electronic equipment of claim 7, wherein the electronic equipment is a magnetic sensor.

9. The MMR device of claim 1, wherein the two-dimensional conductive material layer has thickness of 1-5 atomic layer(s).

10. The MMR device of claim 1, wherein the two-dimensional conductive material layer has thickness of 1-3 atomic layer(s).

* * * * *